United States Patent [19]

Heitert et al.

[11] Patent Number: 4,607,227

[45] Date of Patent: Aug. 19, 1986

[54] OPEN CIRCUIT VOLTAGE TEST DEVICE

[75] Inventors: John S. Heitert, Northville; John R. Van Wiemeersch, Harper Woods, both of Mich.

[73] Assignee: Ford Motor Company, Dearborn, Mich.

[21] Appl. No.: 572,718

[22] Filed: Jan. 20, 1984

[51] Int. Cl.[4] ............................................. G01N 27/46
[52] U.S. Cl. ........................................ 324/437; 101/4; 324/427; 340/636
[58] Field of Search ............... 324/426, 427, 429, 433, 324/435, 437; 340/636; 101/4, 35, 41

[56] References Cited

U.S. PATENT DOCUMENTS

| | | | |
|---|---|---|---|
| 2,690,544 | 9/1954 | Haubursin | 324/426 |
| 2,991,413 | 7/1961 | Taylor | 324/29.5 |
| 3,185,921 | 5/1965 | Sumter | 324/437 |
| 3,437,916 | 4/1969 | Mazurkevics | 324/28 |
| 3,964,039 | 6/1976 | Craford et al. | 340/248 A |
| 4,163,186 | 7/1979 | Haley | 320/48 |
| 4,207,611 | 6/1980 | Gordon | 364/580 |
| 4,342,963 | 8/1982 | Karnowski et al. | 324/427 |
| 4,363,407 | 12/1982 | Buckler et al. | 209/3.3 |
| 4,413,234 | 11/1983 | Lupoli | 324/435 |

FOREIGN PATENT DOCUMENTS

| | | |
|---|---|---|
| 0102428 | 6/1982 | European Pat. Off. . |
| 1413847 | 11/1975 | United Kingdom . |
| 1491918 | 11/1977 | United Kingdom . |
| 1514806 | 6/1978 | United Kingdom . |

OTHER PUBLICATIONS

Car Battery Monitor, Radio and Electronics Constructor, vol. 30, pp. 425–427, Feb. 1977.
Low Battery Indicator, Electronic Engineering, vol. 50, No. 607, p. 11, Mid–May 1978.

Primary Examiner—Stewart J. Levy
Assistant Examiner—Kevin D. O'Shea
Attorney, Agent, or Firm—Paul K. Godwin, Jr.; Clifford L. Sadler

[57] ABSTRACT

A portable hand-held open circuit voltage tester for a storage battery that contains a facility for permanently marking the positive terminal post of the tested battery when the open circuit voltage is within a predetermined range. An enabling circuit provides an indication of the open circuit voltage level and enables the marking mechanism for activation by the operator.

11 Claims, 5 Drawing Figures

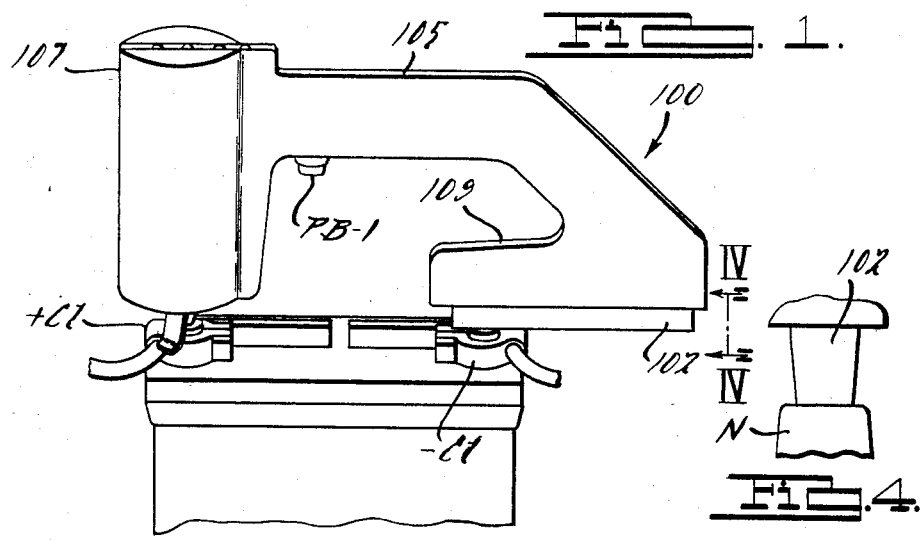
FIG. 1.
FIG. 4.
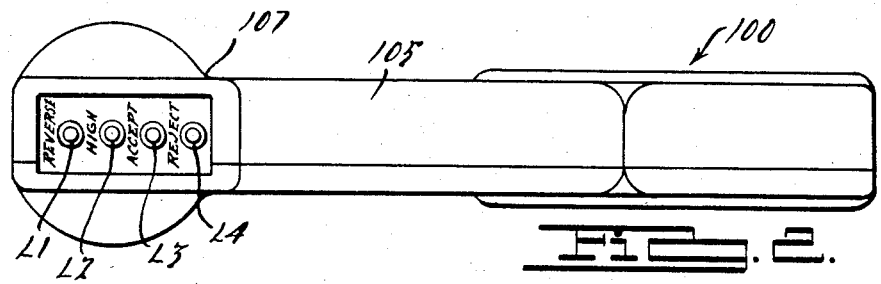
FIG. 2.
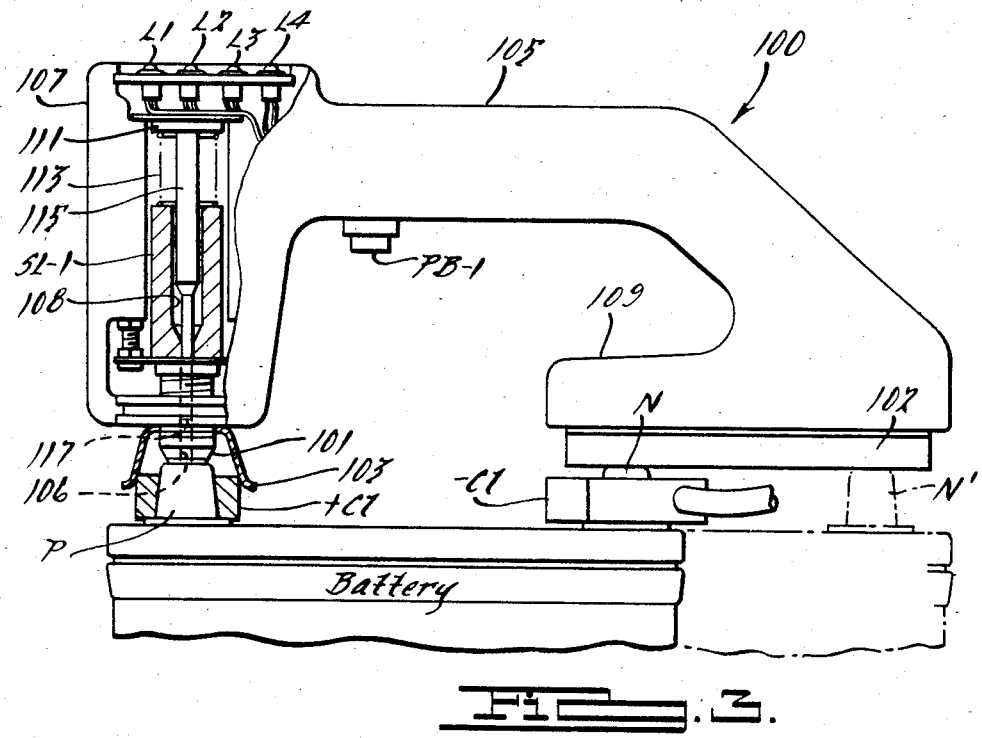
FIG. 3.

OPEN CIRCUIT VOLTAGE TEST DEVICE

BACKGROUND OF THE INVENTION

1. Field of the Invention

The present invention relates to the field of voltage testing and more specifically to the area of checking the open circuit charge condition of storage batteries.

2. Description of the Prior Art

The checking of batteries, subsequent to installation in an automotive vehicle and during its assembly, is an important step in preventing vehicles from being delivered from the assembly facility with faulty batteries. Past systems for checking have involved the use of standard volt meters or in some instances, merely observing whether or not the installed battery has the ability to start the engine of the vehicle. In many cases, if the battery did not have the ability to start the engine, it may have been quick charged to accomplish that function without futher checking as to whether or not the battery was able to hold a full charge. In any event, no apparatus was available which would both verify and audit the condition of the installed battery at the time of its installation.

SUMMARY OF THE INVENTION

The present invention is intended to provide the necessary means by which an individual may check the condition of a lead-acid type storage battery to verify that its open circuit (no load) voltage level is within a prescribed range and to simultaneously mark the battery with an audit indicia indicating that the battery was checked and found to be in an acceptable condition.

The present invention provides a completely portable hand-held unit which utilizes the voltage from the battery being checked to determine and indicate whether the battery is above, below, or within a predetermined range of acceptable voltage values. Enabling circuitry, within the hand-held unit, allows a depressible pushbutton to energize a solenoid that in turn actuates a plunger to stamp an audit indicia onto a selected terminal post of the battery when the measured open circuit voltage of that battery falls within the acceptable range of voltages.

BRIEF DESCRIPTION OF THE DRAWINGS

FIG. 1 is an elevational view of the present invention in its measuring position atop a battery.

FIG. 2 is a top view of the present invention illustrating the voltage indicators.

FIG. 3 provides a cross-sectional view of the head of the present invention containing the actuating solenoid and an electrical terminal.

FIG. 4 is an end view of the elongated electrical terminal of the present invention intended to contact the negative terminal on the battery being checked.

DETAILED DESCRIPTION OF THE PREFERRED EMBODIMENT

Figure 5:
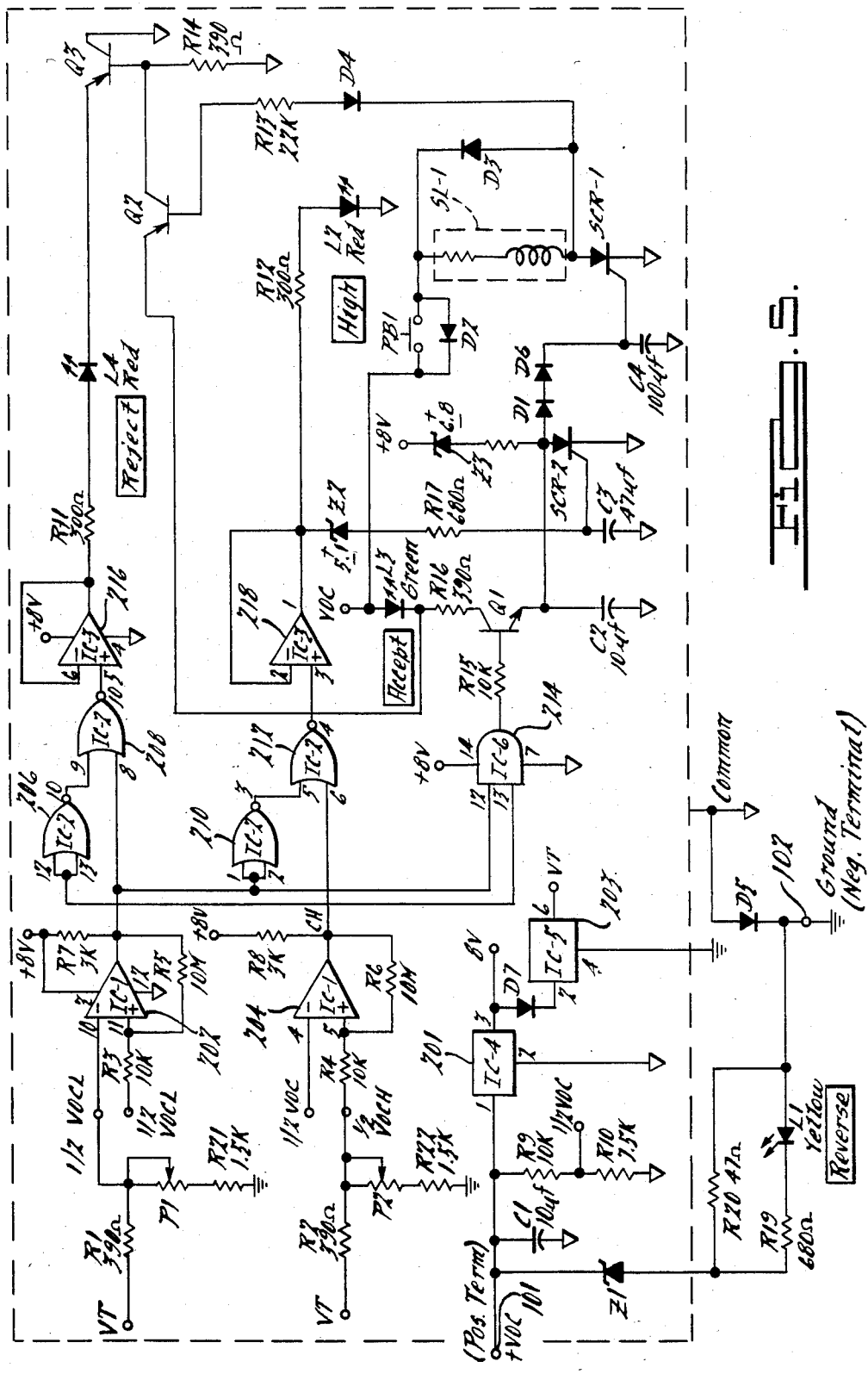
FIG. 5 is a detailed schematic of the enabling circuit of the present invention.

The present invention as shown in FIGS. 1, 2, and 3 as an open circuit battery voltage checking device 100. The device includes a hand-held housing 105 that exposes a first electrical terminal 101 intended for placement in contact with a positive "P" terminal post on a storage battery; a second electrical terminal 102 intended for placement in contact with a negative "N" terminal post on the same storage battery; a pushbutton switch PB-1 mounted beneath the handle of the housing 105; and light emitting diodes indicators (LEDs) L1, L2, L3 and L4 in the top portion of the head 107 of the housing 105 to indicate the status of the battery being checked. Since the major intended use of the present invention 100 is to check the open circuit voltage of batteries installed in vehicles and those batteries normally have clamps +CL and −Cl installed on respective terminal posts P and N, the electrical terminal 101 contains a centering flange 103 that is insulated with respect to the terminal 101 and provides a means by which the terminal may be centered on the post P during the auditing check. The centering flange 103 insures that the indicator marking mechanism will contact the top of the post P, instead of the clamp.

Also, due to the fact that batteries vary in size depending upon their capacity and their expected usage, the device 100 contains an elongated electrical terminal 102 which extends along a radial line defined from the center of the terminal 101 so that batteries having terminal posts separated by a range of distances from N to N' may be checked without modification of the device 100.

As shown in FIGS. 3 and 4, the positive terminal 101 and the negative terminal 102 have lower flat surfaces configured to make positive contact with the upper flat surfaces of the respective P and N terminal posts of the battery.

The terminal 101 contains a central aperture 106 which extends therethrough to allow passage of a marking plunger rod 115. A solenoid SL-1 is mounted in the head 107, above the electrical terminal 101, and contains a cylindrical passage 108 which is concentric with the aperture 106 and contains the plunger rod 115. Plunger rod 115 is spring biased in its upward position by coil spring 113 between the solenoid SL-1 and the upper collar 111 of the plunger 115. The lower end of the plunger 117 contains marking indicia, such as three pin points, which are driven into the top of the post P when the open circuit voltage of the battery is found to be within an acceptable range of values and the pushbutton PB-1 is depressed to thereby allow actuation of the solenoid SL-1.

The enabling circuit which allows the solenoid SL-1 to be actuated when the pushbutton is depressed is shown in FIG. 5. In the enabling circuit, the voltage present at terminals 101 and 102 is used to set up a reference voltage against which the open circuit voltage (VOC) is compared. A logic section provides enabling signals to drivers of the LED indicators to indicate that the open circuit voltage is above, below, or within the acceptable range of voltage levels determined in the reference section. When the open circuit voltage is within the acceptable range, the solenoid SL-1 is enabled so as to be energized by the manual actuation of the pushbutton switch PB-1.

It has been determined that an acceptably performing lead acid type battery will have a open circuit voltage (no load) of between 12.38 volts and 12.80 volts between its negative and positive terminals. Batteries having voltages above 12.80 volts are considered to contain surface charges caused by electrical recharging of the battery. Therefore, batteries having an open circuit voltage of greater than 12.80 volts due to recent recharging fail to indicate the continuing ability of a battery to hold a charge. Of course, batteries having an open circuit voltage below 12.38 volts are considered to be undercharge and are rated as unacceptable.

The +VOC present at terminal 101 with respect to ground terminal 102 is dropped across a voltage divider network of resistor R9 and R10. The relationship between the resistors R9 and R10 is such that the junction between the two resistors provides a voltage of approximately 43% of the VOC. For convenience, this value is indicated as ½ VOC and is supplied to the positive input terminal of a low voltage comparator 202 and to a negative input terminal of an upper voltage comparator 204. Capacitor C1 is connected to the terminal 101 and functions as a stabilizing filter for the input voltage.

An 8-volt regulator circuit 201 is also connected to the terminal 101 so as to provide a regulated 8 volts DC to power the various active components within the circuit. A reference voltage VT, of approximately 6.25 volts, is supplied via the temperature compensating regulator circuit 203, which is connected through diode D7 to the regulated 8-volt supply and to ground terminal 102. The temperature regulated voltage VT is supplied to resistor R1, which is part of calibration voltage divider connected to the negative input terminal 10 of the low voltage comparator circuit 202. A potentiometer P1 and resistor R21 complete the calibration voltage divider circuit between VT and ground. The potentiometer P1 is calibrated, prior to usage of the device, so that the voltage present at the negative input terminal 10 of the low voltage comparator circuit 202 is approximately one-half of the lowest acceptable voltage of 12.38 and is designated as ½ VOCL. The ½ VOC is connected through resistor R3 to the positive input terminal 11 of the low voltage comparator circuit 202. Therefore, whenever the VOC exceeds 12.38 volts, the output CL of the low voltage comparator circuit 202 will provide a high "1" level output signal on terminal 13.

The high voltage comparator circuit 204 operates in a similar manner to the low voltage comparator circuit 202. The sample ½ VOC is connected to negative input terminal 4 and the VT reference voltage is dropped through resistor R2, potentiometer P2 and resistor R22, and is sensed at the positive input terminal 5 of comparator 204. Therefore, whenever the voltage sampled on negative input terminal 4 indicates that the VOC is below 12.80 volts, the high voltage comparator circuit 204 provides a high "1" level output signal.

In the event the sampled VOC is below 12.38 volts, the CL output signal of the low voltage comparator 202 will be at a low "0" level and the CH output signal of the high voltage comparator 204 will be at a high "1" level. NOR-gates 206 and 208 sense the outputs CL and CH of the comparators 202 and 204 to provide a high level output to current amplifier 216. Current amplifier 216 provides an output signal through resistor R11 to a red "REJECT" LED L4 in series with the emitter of a PNP transistor Q3 that is normally biased in its saturated condition.

On the other hand, if the sampled VOC is above 12.80 volts, the CH signal from the high voltage comparator 204 is at a low "0" level while the output CL of the low voltage comparator 202 is at a high "1" level. NOR-gates 210 and 212 correspondingly provide a high level input to current amplifier 218 that in turn supplies energizing current through resistor R12 to a red "HIGH" LED L2 to thereby indicate that the VOC is above 12.80 volts.

In the event the VOC is within the acceptable range above 12.38 volts and below 12.80 volts, both the CL output signal and the CH output signal will be at high "1" level and supplied to individual input terminals of an AND-gate 214. At that time, the output of the AND-gate 214 provides a signal through resistor R15 to the base of NPN transistor Q1 which drives Q1 to its saturated condition. A green "ACCEPT" LED L3 is in the collector path of the transistor Q1 in series with resistor R16. LED 13 has its anode connected to the VOC and is energized when Z1 is saturated to indicate the acceptability of the battery being tested. The emitter of the transistor Q1 is connected to a filter capacitor C2 to prevent high dV/dt signals from inadvertently enabling the solenoid SL-1. The solenoid SL-1 is enabled only when the transistor Q1 is in its saturated condition due to the fact that SCR 1 is triggered on by the voltage present at the emitter of transistor Q1 through diodes D1 and D6. A capacitor C4 is connected to the junction between diode D6 and SCR 1 to provide a filtering function for high dV/dt signals and prevent misfiring of the solenoid. When the solenoid SL-1 is enabled by Q1 and SCR 1, the solenoid may be activated by a manual depression of pushbutton switch PB-1 connected between the VOC and the solenoid SL-1.

A PNP transistor Q2 is installed between the cathode of LED L3 and the base of transistor Q3 with its base connected through resistor R13 and diode D4 to the anode of SCR 1. Q2 functions to latch the LED L-3 in an energized condition, in the event the activation of the pushbutton switch PB-1 and energization of the solenoid SL-1 causes the VOC to drop below the 12.38 volt level. Without the latching by transistor Q2, the LED L3 would blink off when the VOC dropped below 12.38 volts due to the depressing of pushbutton PB-1. The latching transistor Q2 also has the effect of inhibiting the actuation of the LED L4 by biasing the transistor Q3 in a nonconducting state when Q2 is in its saturated condition. Therefore, if the pushbutton PB-1 is depressed and the solenoid SL-1 causes the VOC to drop below 12.38 volts, the green LED L3 will remain on and the red LED L4 will remain off.

In order to prevent a high VOC (above 12.80 volts) from causing inadvertent enabling of the solenoid SL-1 by rapidly and repeatedly contacting the VOC terminals 101 and 102 to the battery and making the circuit believe that the average VOC voltage is within the acceptable range, an inhibiting circuit is provided. That circuit comprises zener diode Z2, capacitor C3, SCR-2 resistor R-18 and zener diode Z3. In operation, the SCR-2 is pulsed on whenever the red LED L2 is energized and thereby effectively holds the gate of the SCR-1 grounded.

In operation, the technician places the device 100 of the present invention onto the terminal posts of a battery to be checked and monitors the LED indicators on the head 107 of the housing 105. If the VOC is within the range of 12.38 volts to 12.80 volts, the green "ACCEPT" LED L3 is energized and the technician may depress the pushbutton switch PB-1 to cause the piston rod 115 within the solenoid SL-1 to be driven through the cylindrical aperture 106 of the positive electrical terminal 101 and cause the indicia to be pressed into the soft upper surface of the "P" terminal post of the battery.

In the event the technician applies the unit to a battery in the reverse polarity, a reverse polarity circuit provides protection to the enabling circuit and also causes a yellow "REVERSE" LED L1 to be energized indicating reverse polarity. The reverse polarity protection circuit includes a zener diode Z1 having its cathode connected to terminal 101 and its anode connected to a junction between resistor R20 and resistor R19. Resistor R20 shunts excess current around the LED L1 and its series resistor R19 in the event the pushbutton PB-1 is depressed while the solenoid SL-1 is enabled during removal of the device from the battery.

The following parts list specifies the commercial availability of the various integrated circuits, transistors and thyristors shown in the schematic.

| Component Integrated Circuits | Part No. | Description |
| --- | --- | --- |
| IC1 | LM139J | Quad Voltage Comparator (M)* |
| IC2 | MC14001BCJ | CMOS Quad 2-Input NOR (M) |
| IC3 | TL092CP | Dual NFET Op AMP (TI)** |
| IC4 | MC78MO8CT | 8V-5A Positive Voltage Regulator (M) |
| IC5 | MC1404AU6 | Precision Low-Drift 6.25 V Reference (M) |
| IC6 | CD4081BCJ | CMOS Quad 2-Input AND (M) |
| Transistors | | |
| Q1 | 2N4401 | NPN Silicon Switching Transistor (M) |
| Q2, Q3 | 2N4403 | PNP Silicon Switching Transistor (M) |
| Thyristors | | |
| SCR1 | 2N6405 | 16A rms-800 V Silicon Controlled Rectifier (M) |
| SCR2 | 2N5062 | 0.8A rms-100 V Silicon Controlled Rectifier (M) |

*(M) = Motorola
**(TI) = Texas Instruments

While it is apparent that many modifications and variations may be implemented without departing from the scope of the novel concept of this invention, it is intended by the appended claims to cover all such modifications and variations which fall within the true spirit and scope of the invention.

We claim:

1. An open circuit battery voltage checking device comprising:
   a first electrical terminal intended for placement in contact with a positive terminal post on a storage battery;
   a second electrical terminal intended for placement in contact with a negative terminal post on a storage battery;
   means adjacent one of said first and second terminals for marking the correspondingly contacted terminal post with a distinguishing feature;
   a solenoid for actuating said marking means whereby the marking means is brought into contact with the said contacted terminal post;
   circuit means connected to said first and second terminals for enabling said solenoid when the open circuit voltage between said first and second terminals is within a predetermined range of values; and
   manually actuatable means for energizing said solenoid when manually actuated and when said solenoid is enabled by said enabling circuit means.

2. A device as in claim 1 further including a unitary housing for retaining each of the components of the device and being configured to be held in a single hand of a human operator, wherein said manually actuatable energizing means includes a pushbutton switch mounted on said housing for actuation by said single hand of said operator.

3. A device as in claim 2, wherein said first electrical terminal includes an insulated guide means for centering said terminal on said battery post when contacting said post.

4. A device as in claim 2, wherein said first electrical terminal is cylindrical shaped and is mounted on said housing so as to contact the top flat surface of a positive terminal post on said storage battery; and said solenoid and said marking means are mounted within said housing concentric with said first electrical terminal so as to mark the top flat surface of said positive terminal post.

5. A device as in claim 4, wherein said first electrical terminal contains a flat lower surface for contacting said top flat surface of said positive terminal post and a cylindrical aperture extending from said lower surface into said housing; said solenoid contains a cylindrical passage concentric with said cylindrical aperture; and said marking means comprises a movable piston rod longitudinally mounted within said passage for longitudinal movement through said aperture when actuated by said solenoid.

6. A device as in claim 5, wherein said movable piston rod contains distinguishing indicia means on its lower end closest to said aperture, whereby, upon actuation, said indicia means is forceably driven through said aperture of said first terminal and into the top flat surface of said positive post to indicate that said open circuit voltage between said first and second terminals is within said predetermined range of values.

7. A device as in claim 6, wherein said second terminal is configured along a radial line defined to extend from said first terminal so as to contact said negative terminal post of said storage battery and thereby be useable to check said open circuit voltage for batteries with difference distances of separation between said positive and negative terminal posts.

8. A device as in claim 1, wherein said device also includes a first means connected to said enabling circuit for indicating when said open circuit voltage between said first and second terminals is within said predetermined range of values.

9. A device as in claim 8, wherein said device also includes a second means connected to said enabling circuit for indicating when said open circuit voltage between said first and second terminals is above said predetermined range of values.

10. A device as in claim 8, wherein said device also includes a third means connected to said enabling circuit for indicating when said open circuit voltage between first and second terminals is lower than said predetermined range of values.

11. A device as in claim 8, wherein said device also includes a fourth means connected to said enabling circuit for indicating when said open circuit voltage between first and second terminals is of opposite polarity.

* * * * *